United States Patent
Hong et al.

(10) Patent No.: US 11,670,739 B2
(45) Date of Patent: Jun. 6, 2023

(54) LED PACKAGE STURCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Hao-Wei Hong, New Taipei (TW); Chen-Hsiu Lin, New Taipei (TW); Tsung-Kang Ying, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 162 days.

(21) Appl. No.: 17/146,460

(22) Filed: Jan. 11, 2021

(65) Prior Publication Data
US 2021/0226099 A1 Jul. 22, 2021

Related U.S. Application Data

(60) Provisional application No. 62/963,195, filed on Jan. 20, 2020.

(30) Foreign Application Priority Data

Sep. 23, 2020 (CN) .......................... 202011007230.2

(51) Int. Cl.
*H01L 33/48* (2010.01)
*H01L 33/50* (2010.01)
*H01L 33/54* (2010.01)
*H01L 33/62* (2010.01)
*H01L 33/56* (2010.01)
*H01L 25/075* (2006.01)

(52) U.S. Cl.
CPC .......... *H01L 33/486* (2013.01); *H01L 33/502* (2013.01); *H01L 33/54* (2013.01); *H01L 33/62* (2013.01)

(58) Field of Classification Search
CPC .... H01L 25/0753; H01L 33/486; H01L 33/48
See application file for complete search history.

(56) References Cited

U.S. PATENT DOCUMENTS 11,387,395 B2 * 7/2022 Yun .......................... H01L 33/62

FOREIGN PATENT DOCUMENTS

WO WO-2012121304 A1 * 9/2012 ......... H01L 25/0753
WO WO-2019045167 A1 * 3/2019 ......... H01L 25/0753

* cited by examiner

*Primary Examiner* — Antonio B Crite
(74) *Attorney, Agent, or Firm* — Li & Cai Intellectual Property Office

(57) ABSTRACT

A light emitting diode (LED) package structure including a first light emitting portion, a second light emitting portion, a partition, and a surrounding wall is provided. The first light emitting portion includes a first LED chip emitting a first initial light, and the first initial light passes through the first light emitting portion to form a first white light. The second light emitting portion includes a second LED chip, a third LED chip, and a fourth LED chip. The partition is disposed between the first light emitting portion and the second light emitting portion. The surrounding wall is disposed around the partition, the first light emitting portion, and the second light emitting portion. The first white light has a view angle offset less than 1 degree.

20 Claims, 11 Drawing Sheets

LED PACKAGE STURCTURE

CROSS-REFERENCE TO RELATED PATENT APPLICATION

This application claims priority to the U.S. Provisional Patent Application Ser. No. 62/963,195 filed on Jan. 20, 2020, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting diode (LED) package structure, and more particularly to an LED package structure that shortens an optical distance.

BACKGROUND OF THE DISCLOSURE

A white light emitted by a white light LED package structure is usually formed through mixing a red light, a blue light and a green light. Generally speaking, light sources of three colors require a predetermined optical distance to form a white light source with enhanced light mixing uniformity. However, if the working distance is shorter than the optical distance (in other words, if the optical distance is not short enough), the generated white light source can be interfered by other colors due to an incomplete light mixing.

Therefore, it has become an important matter in the industry to shorten the optical distance that is required for the white light source emitted by the LED package structure through structural design, so as to enhance the light mixing effect of the LED package structure.

SUMMARY OF THE DISCLOSURE

In response to the above-referenced technical inadequacies, the present disclosure provides a light emitting diode (LED) package structure.

In one aspect, the present disclosure provides an LED package structure including a first light emitting portion, a second light emitting portion, a partition, and a surrounding wall. The first light emitting portion includes a first LED chip emitting a first initial light, and the first initial light passes through the first light emitting portion to form a first white light. The second light emitting portion includes a second LED chip emitting a second initial light, a third LED chip emitting a third initial light, and a fourth LED chip emitting a fourth initial light. The partition is disposed between the first light emitting portion and the second light emitting portion. The surrounding wall is disposed around the partition, the first light emitting portion, and the second light emitting portion. The first white light has a view angle offset less than 1 degree.

In certain embodiments, the partition has a height less than that of the surrounding wall.

In certain embodiments, a volume of the second light emitting portion is greater than that of the first light emitting portion.

In certain embodiments, the second initial light is green, the third initial light is red, and the fourth initial light is blue.

In certain embodiments, the second LED chip, the third LED chip, and the fourth LED chip are sequentially arranged from adjacent to the partition toward a direction away from the partition.

In certain embodiments, a view angle of the first white light is 110 degrees.

In certain embodiments, each of the first white light, the second initial light, the third initial light, and the fourth initial light has a view angle offset less than 7 degrees.

In certain embodiments, a height of the partition is between that of each of the LED chips and 80% of that of the surrounding wall.

In certain embodiments, the first initial light is blue.

In certain embodiments, the LED package structure further includes a wavelength conversion element containing phosphor, and the wavelength conversion element covers the first LED chip.

In certain embodiments, an amount of the phosphor of the wavelength conversion element is between 5 wt % and 45 wt %.

In certain embodiments, the LED package structure further includes an encapsulant, and the encapsulant covers the second LED chip, the third LED chip, and the fourth LED chip.

In certain embodiments, the encapsulant further covers the partition and the wavelength conversion element.

In certain embodiments, the encapsulant contains a diffuser.

In certain embodiments, an amount of the diffuser in the encapsulant is between 0.1 wt % and 5.0 wt %.

In certain embodiments, the encapsulant has a light transmittance greater than 80%.

In another aspect, the present disclosure provides an LED structure including a casing, a first LED chip, a second LED chip, a third LED chip, and a fourth LED chip. The casing includes a base, a surrounding wall, a recess and a partition. The surrounding wall is disposed on the base, and the recess is formed by the surrounding wall and the base. The partition is disposed on the base and connected to the surrounding wall, and divides a part of the recess into a first accommodating space and a second accommodating space. The first LED chip is disposed in the first accommodating area, and the second LED chip, the third LED chip, and the fourth LED chip are disposed in the second accommodating space. A height of the partition is less than that of the surrounding wall.

In certain embodiments, a volume of the second accommodating space is greater than that of the first accommodating space.

In certain embodiments, the second LED chip, the third LED chip, and the fourth LED chip are sequentially arranged from adjacent to the partition toward a direction away from the partition.

In certain embodiments, the base includes a plurality of leads, and the first LED chip, the second LED chip, the third LED chip, and the fourth LED chip are disposed on the leads, respectively.

In certain embodiments, each of the leads has a cantilever section and a bended section, and the bended section is connected to one side of the cantilever section.

In certain embodiments, at least one of the leads has an inverted hook portion.

In certain embodiments, at least one of the leads is a common anode or a common cathode.

In certain embodiments, each of the cantilever sections further includes a step portion, and each of the step portions has a thickness less than half of that of the cantilever section.

In certain embodiments, each of the bended sections has recess portions on two sides thereof, respectively.

In certain embodiments, the surrounding wall has a first long side and a second long side, the first long side has a strengthening portion on two sides thereof, and the second long side has a rib portion.

In certain embodiments, a height of the partition is between that of each of the LED chips and 80% of that of the surrounding wall.

In certain embodiments, the LED package structure further includes a wavelength conversion element containing phosphor, and the wavelength conversion element covers the first LED chip.

In certain embodiments, an amount of the phosphor of the wavelength conversion element is between 5 wt % and 45 wt %.

In certain embodiments, the LED package structure further includes an encapsulant, and the encapsulant covers the second LED chip, the third LED chip, and the fourth LED chip.

In certain embodiments, the encapsulant further covers the partition and the wavelength conversion element.

In certain embodiments, the encapsulant contains a diffuser.

In certain embodiments, an amount of the diffuser in the encapsulant is between 0.1 wt % and 5.0 wt %.

In certain embodiments, the encapsulant has a light transmittance greater than 80%.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
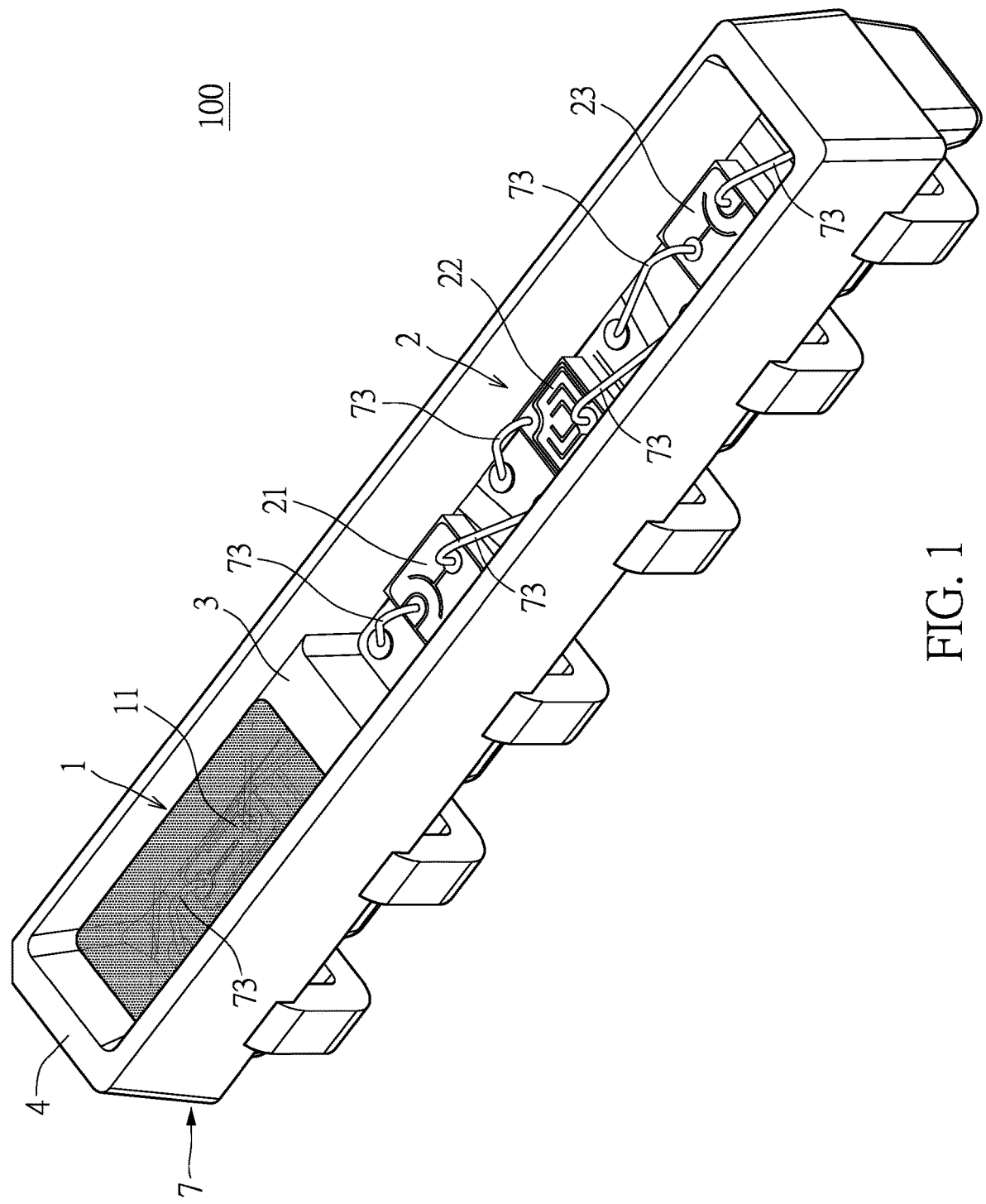
FIG. 1 is a schematic perspective view of a LED package structure in an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiment

Figure 2:
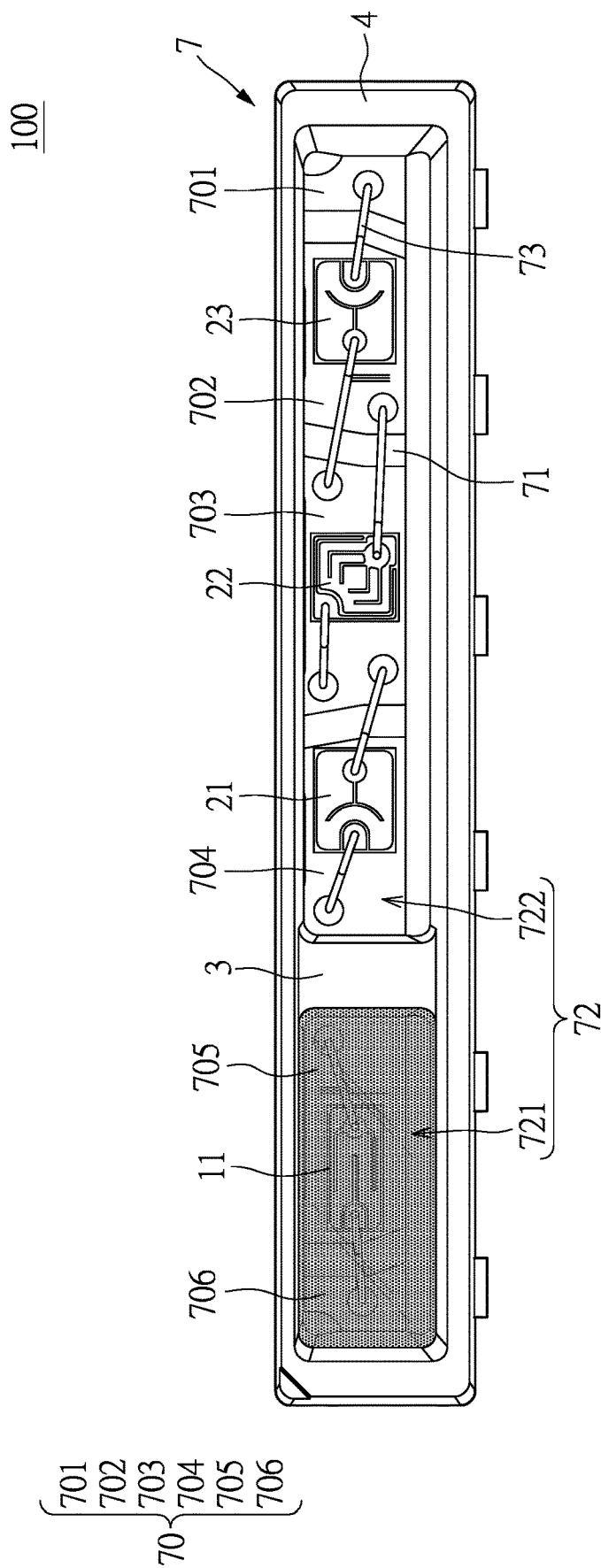
FIG. 2 is a top schematic view of FIG. 1.
Figure 3:
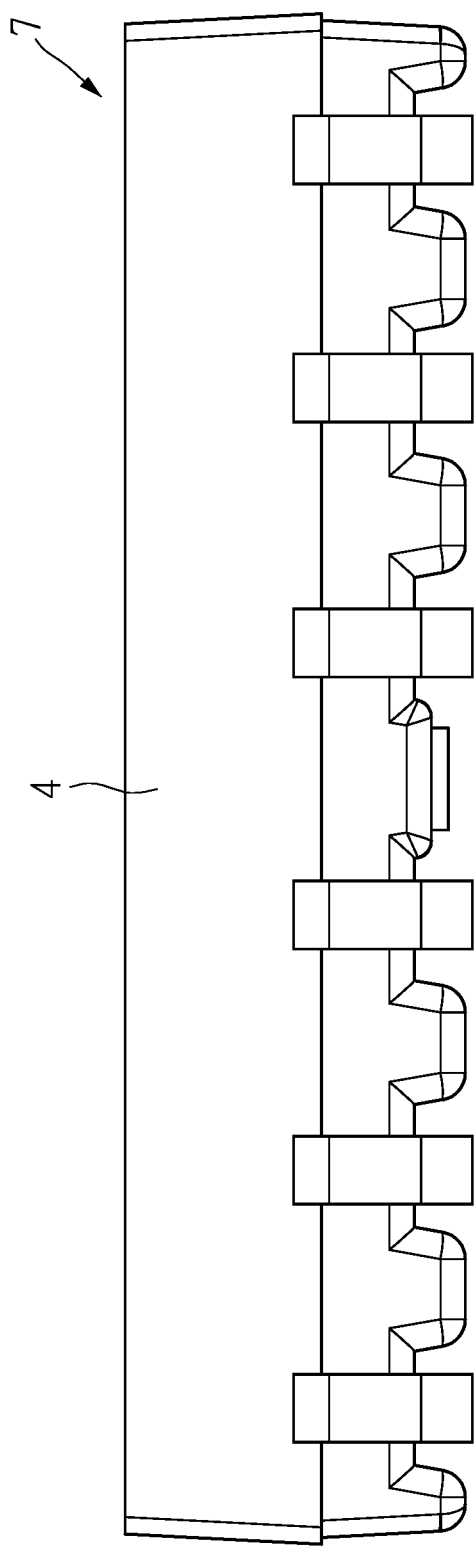
FIG. 3 is a front schematic view of FIG. 1.
Figure 4:
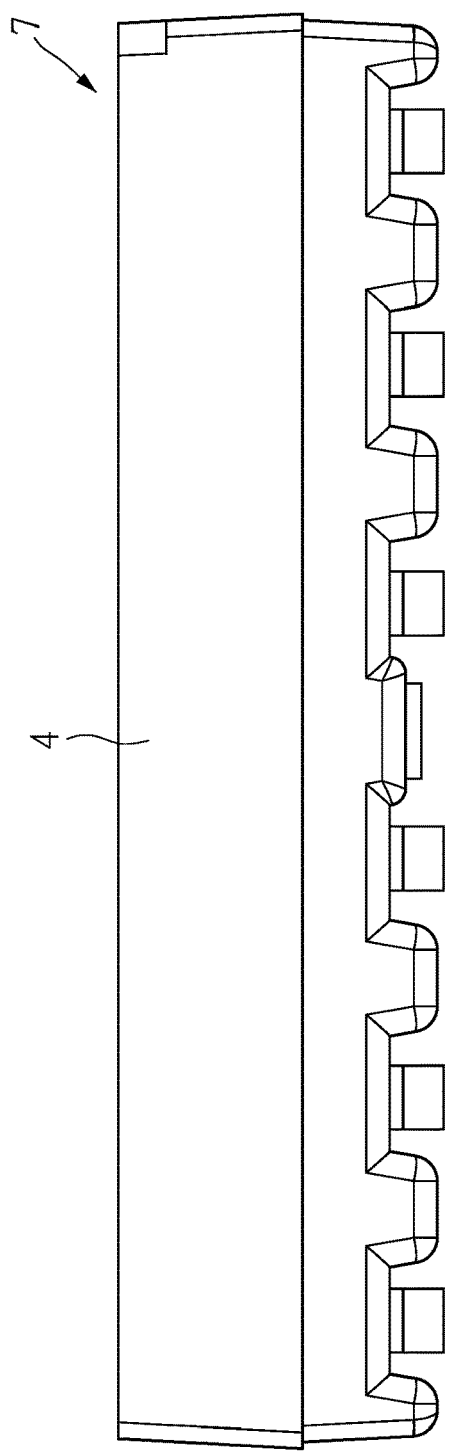
FIG. 4 is a back schematic view of FIG. 1.
Figure 5:
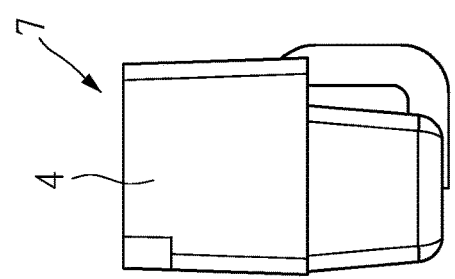
FIG. 5 is a left side schematic view of FIG. 1.

References are made to FIG. 1 to FIG. 5. FIG. 1 is a schematic perspective view of an LED package structure in an embodiment of the present disclosure. FIG. 2 is a top schematic view of FIG. 1. FIG. 3 is a front schematic view of FIG. 1. FIG. 4 is a back schematic view of FIG. 1. FIG. 5 is a left side schematic view of FIG. 1. As shown in FIG. 1, the present disclosure provides a light emitting diode (LED) package structure 100 including a first light emitting portion 1, a second light emitting portion 2, a partition 3, and a surrounding wall 4. The first light emitting portion 1 includes a first LED chip 11, and the second light emitting portion 2 includes a second LED chip 21, a third LED chip 22, and a fourth LED chip 23. The partition 3 is disposed between the first light emitting portion 1 and the second light emitting portion 2. The surrounding wall 4 is disposed around the partition 3, the first light emitting portion 1, and the second light emitting portion 2. In other words, the partition 3 divides a light emitting portion surrounded by the surrounding wall 4 into the first light emitting portion 1 and the second light emitting portion 2, and a volume of the second light emitting portion 2 is greater than that of the first light emitting portion 1.

Moreover, as shown in FIG. 2, the LED package structure 100 mainly includes a casing 7, and the first LED chip 11, the second LED chip 21, the third LED chip 22, and the fourth LED chip 23 that are disposed inside the casing 7. The casing 7 includes a base 71, the surrounding wall 4, a recess 72 and the partition 3. The surrounding wall 4 is disposed on the base 71, and the recess 72 is formed by the surrounding wall 4 and the base 71. The partition 3 is disposed on the base 71 and connected to the surrounding wall 4. The partition 3 divides a part of the recess 72 into a first accommodating space 721 and a second accommodating space 722, and a volume of the second accommodating space 722 is greater than that of the first accommodating area 721. The first LED chip 11 is disposed in the first accommodating area 721, and the second LED chip 21, the third LED chip 22, and the fourth LED chip 23 are disposed in the second accommodating space 722. In addition, it can be observed by comparing FIG. 1 and FIG. 2 that the first accommodating area 721 corresponds to the first light emitting portion 1, and the second accommodating space 722 corresponds to the second light emitting portion 2.

Figure 6:
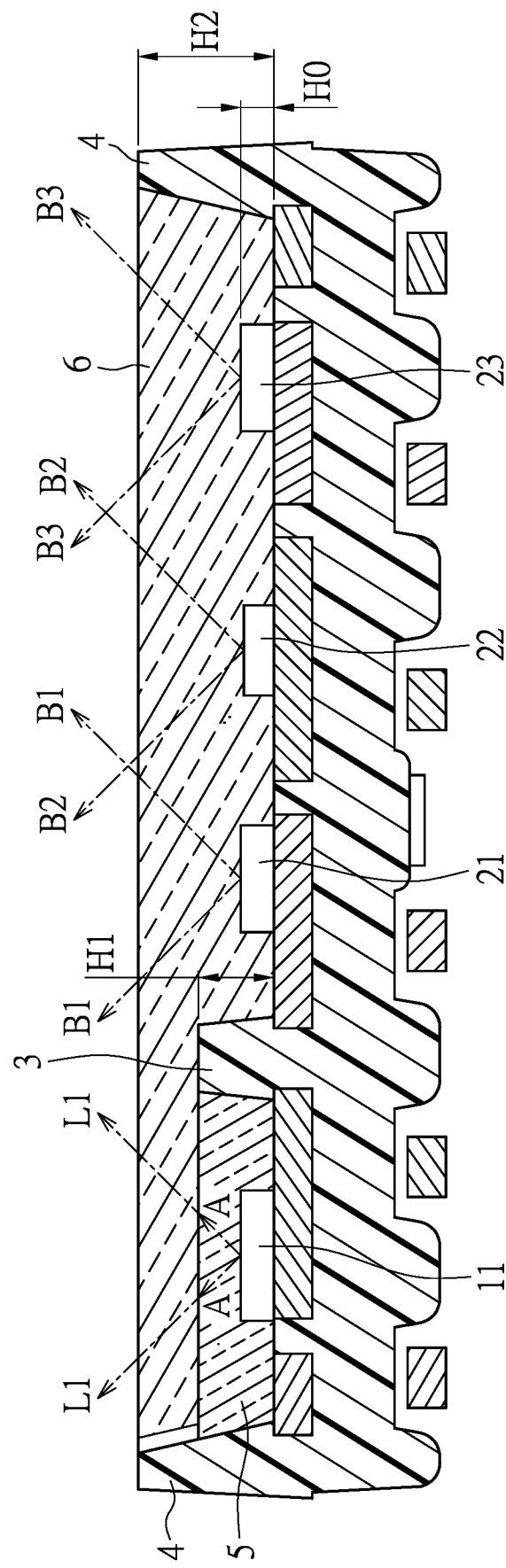
FIG. 6 is a cross-sectional schematic view of the LED package structure in the embodiment of the present disclosure.

Reference is made to FIG. 6, which is a cross-sectional schematic view of the LED package structure in the embodiment of the present disclosure. The first LED chip 11 emits a first initial light A, the second LED chip 21 emits a second initial light B1, the third LED chip 22 emits a third initial light B2, and the fourth LED chip 23 emits a fourth initial light B3. The first initial light A passes through the first light emitting portion 1 to form a first white light L1. According to actual requirements, the LED package structure 100 of the present disclosure can have a first white light L1, the second initial light B1, the third initial light B2, and the fourth initial light B3 independently emitted to the external environment, or have the second initial light B1, the third initial light B2, and the fourth initial light B3 respectively or together mixed with the first white light L1 and then emitted to the external environment. However, the optical distance should be taken into account when the lights are mixed. When the LED package structure 100 is utilized in a backlight module, a severe non-uniformity of light mixing can result from a distance between a light guide plate and the LED package structure 100 being less than the optical distance. Therefore, reducing the optical distance is crucial for miniaturization of end products.

Figure 7:
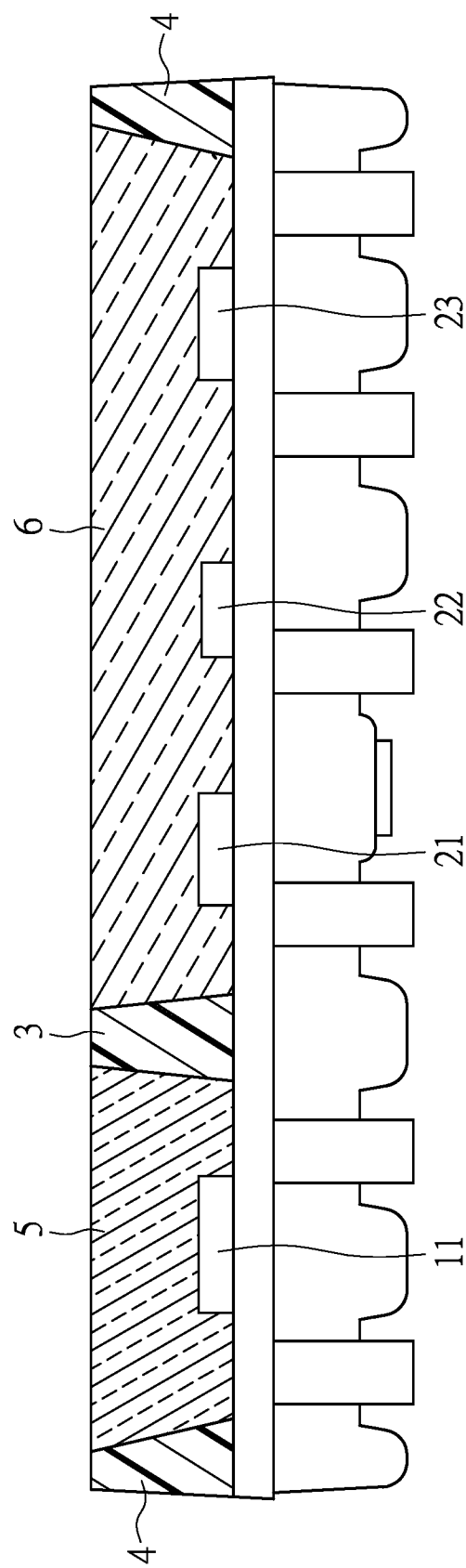
FIG. 7 is a cross-sectional schematic view of a conventional LED package structure.

To be more specific, references are made to FIG. 6 and FIG. 7. FIG. 7 is a cross-sectional schematic view of a conventional LED package structure. Wires (i.e., wires 73) that are shown in FIG. 1 are not shown in FIG. 6 and FIG. 7. FIG. 7 shows an LED package structure having a leveled wall structure (the surrounding wall 4 and the partition 3 are leveled to each other), in which the optical distance is approximately 8 millimeters. However, in the LED package structure 100 of the present disclosure as shown in FIG. 6, a height H1 of the partition 3 is less than a height H2 of the surrounding wall 4. Furthermore, the height H1 of the partition 3 is between a height H0 of each of the aforementioned LED chips, and 80% of the height H2 of the surrounding wall 4. The optical distance can be further shortened to approximately 2 millimeters through limiting the height H1 of the partition 3 of the present disclosure.

When a comparison is made between FIG. 6 and FIG. 7, the partition 3 having the limited height H1 in the present disclosure as shown in FIG. 6 is lower than the partition 3 (which is leveled with the surrounding wall 4) as shown in FIG. 7. The height H1 of the partition 3 of the present disclosure has the advantage of shortening the optical distance and reducing a view angle offset of the first white light L1.

Figure 8:
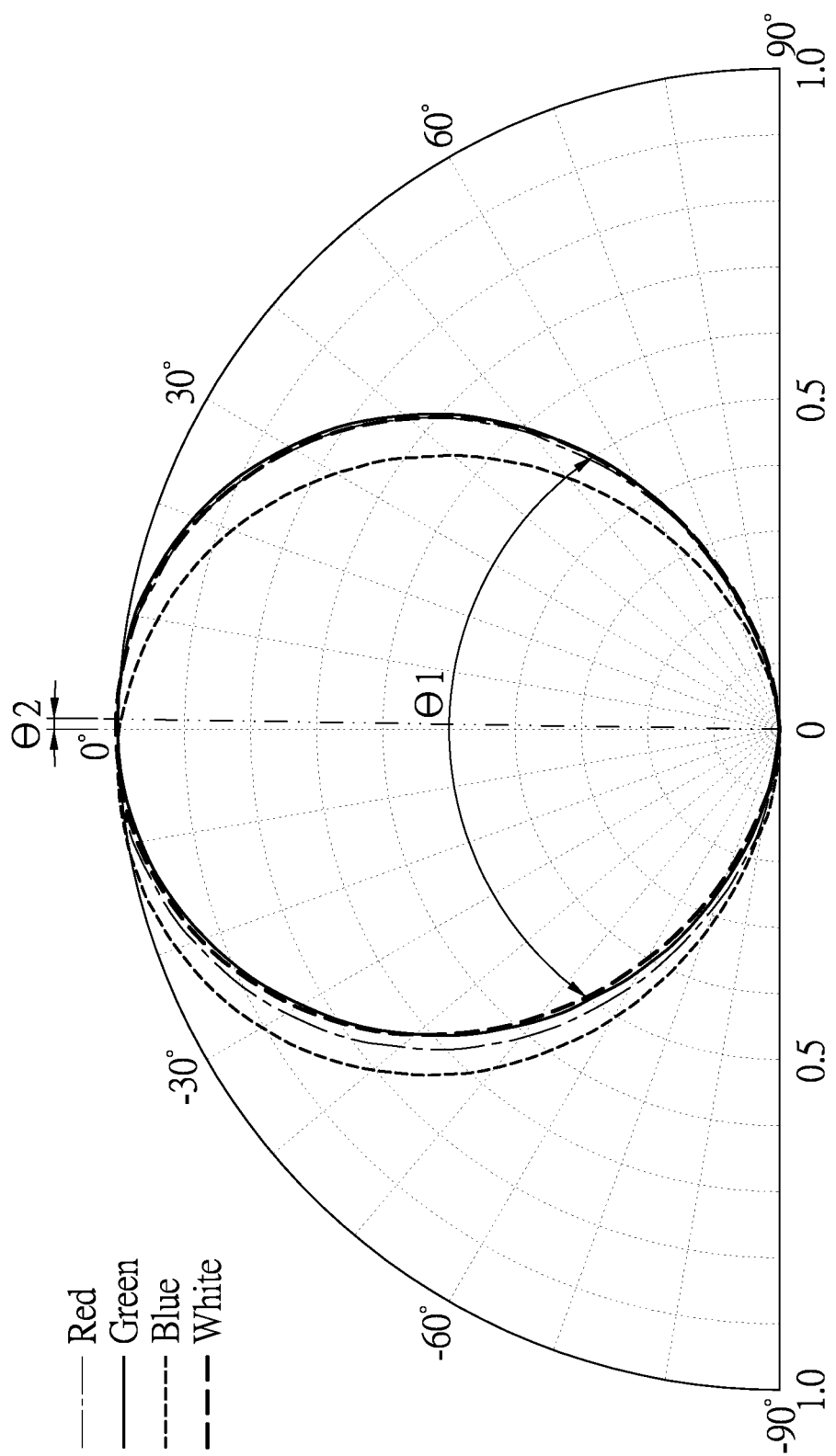
FIG. 8 is a schematic view showing a light offset of the LED package structure in the embodiment of the present disclosure.
Figure 9:
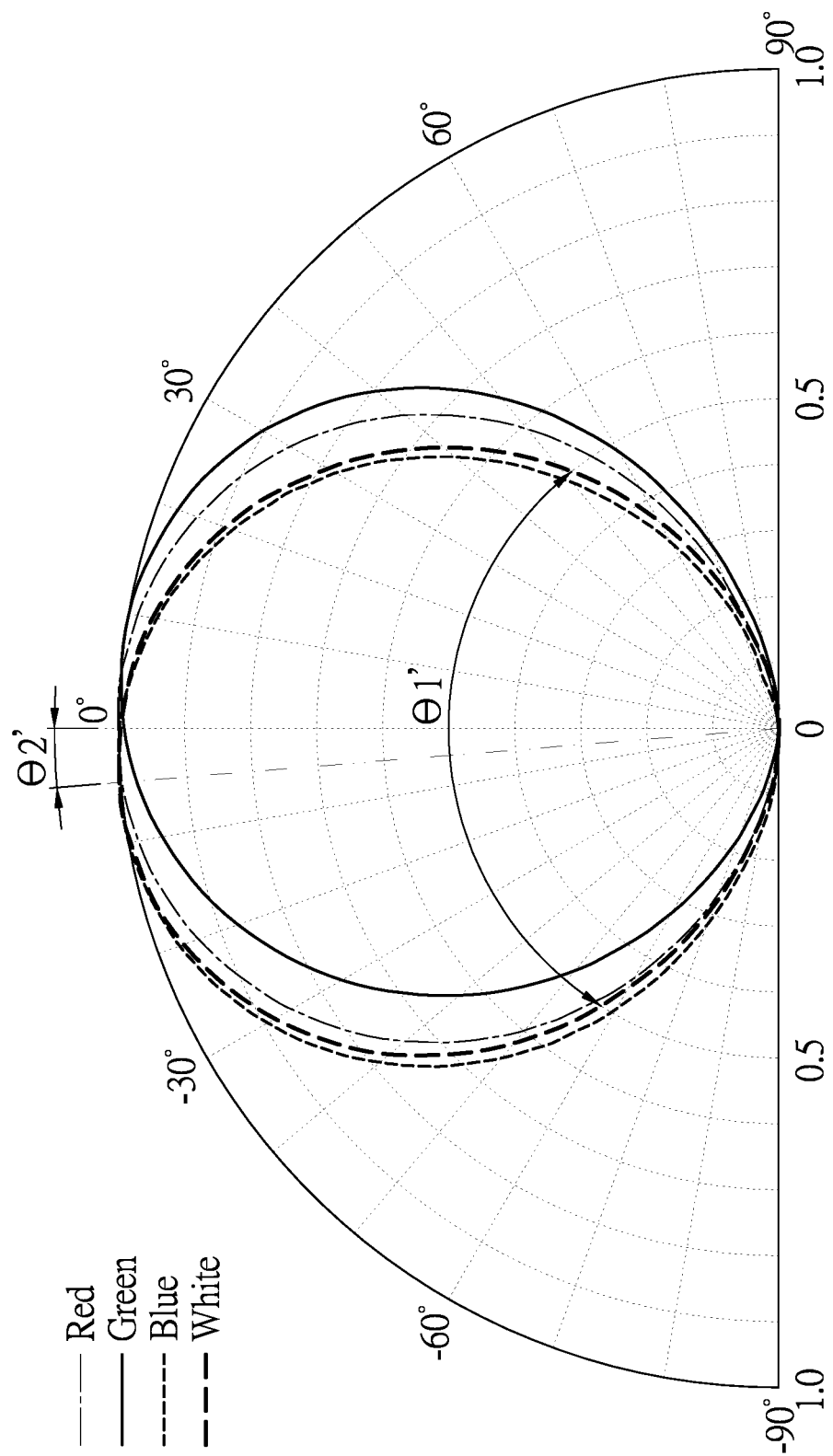
FIG. 9 is a schematic view showing a light offset of the conventional LED package structure.

References are made to FIG. 8 and FIG. 9. FIG. 8 is a schematic view showing a light offset of the LED package structure in the embodiment of the present disclosure, which corresponds to an unleveled wall structure (i.e., the surrounding wall 4 being taller than the partition 3) shown in FIG. 6. FIG. 9 is a schematic view showing a light offset of the conventional LED package structure, which corresponds to the leveled wall structure (the surrounding wall 4 and the partition 3 are leveled to each other) shown in FIG. 7. FIG. 8 and FIG. 9 show a luminous range (i.e., an oval indicated by one of different dotted lines) of each of the first white light L1, the second initial light B1 (green light), the third initial light B2 (red light), and the fourth initial light B3 (blue light). The view angle is an angle summation of angles respectively formed between where the luminous intensity is 50% of the greatest luminous intensity of a light source and a boundary on each of two sides of the luminous range. In addition, the view angle offset refers to an angle formed between where a light source has the greatest luminous intensity and the center of the light source, i.e., a bias angle formed between where the light source has the greatest luminous intensity and the center of the light source.

References are further made to FIG. 8 and FIG. 9, which are to be read in conjunction with Table 1 below, so as to further compare the effect of height differences between the surrounding wall 4 and the partition 3 on the luminous range. As shown in FIG. 8, in the unleveled wall structure, the height H1 of the partition 3 is approximately 0.25 mm, and the height H2 of the surrounding wall 4 is approximately 0.45 mm, i.e., the height H1 of the partition 3 being approximately 56% of the height H2 of the surrounding wall 4. At this time, the first white light L1 has a view angle $\theta_1$ of 110 degrees, and the bias angle $\theta_2$ (the view angle offset of the first white light L1) of where the first white light L1 has the greatest luminous intensity relative to the center of the first LED chip 11 is less than 1 degree, and more specifically 0.9 degrees. As shown in FIG. 9, in the leveled wall structure, a view angle $\theta_1'$ of the first white light L1 is 108.5 degrees, and the bias angle $\theta_2'$ (the view angle offset of the first white light L1) of where the first white light L1 has the greatest luminous intensity relative to the center of the first LED chip 11 is 4.5 degrees. The above-mentioned description indicates that the unleveled wall structure has the advantage of an increased view angle, and the bias angle is more adjacent to the center of each of the chips for 3.6 degrees compared to that of the leveled wall structure. Therefore, the unleveled wall structure of the present disclosure is more advantageous for uniform light mixing and can shorten the optical distance effectively.

TABLE 1

| | Light color | Leveled wall structure | Unleveled wall structure |
|---|---|---|---|
| View angle (degree) $\theta_1$, $\theta_1'$ | White | 108.5 | 110.0 |
| | Red | 111.2 | 111.6 |
| | Green | 107.3 | 110.9 |
| | Blue | 108.4 | 109.4 |
| Bias angle (degree) $\theta_2$, $\theta_2'$ | White | −4.5 | 0.9 |
| | Red | 0.2 | 0.2 |
| | Green | 6.7 | 1.3 |
| | Blue | −6.5 | −6.8 |

Moreover, in addition to the view angle offset of the first white light L1 being less than 1 degree, the second initial light B1, the third initial light B2, and the fourth initial light B3 each have a view angle offset less than or equal to 7 degrees.

Reference is further made to FIG. 6. In the present disclosure, the first initial light A emitted by the first LED chip 11 is blue. The LED package structure 100 further includes a wavelength conversion element 5 containing phosphor, and the wavelength conversion element 5 covers the first LED chip 11 and fills in the first accommodating space 721, i.e., the first light emitting portion 1 being fully filled with the wavelength conversion element 5. For example, the phosphor can be yellow phosphor, such that the blue light emitted by the remained first LED chip 11 is mixed with yellow light emitted by the yellow phosphor to form white light. On the other hand, the phosphor can be red phosphor or green phosphor, such that the remained blue light emitted by the first LED chip 11 is mixed with red or green light emitted by the red phosphor or the green phosphor to form white light. Therefore, the first initial light A passes through the first light emitting portion 1 through the wavelength conversion element 5, and mixes with the light (yellow light, or red light and green light) generated by the phosphor contained in the wavelength conversion element 5, thereby forming the first white light L1. The amount of the phosphor contained in the wavelength conversion element 5 is substantially between 5 wt % and 45 wt %. Preferably, in the present disclosure, the phosphor contained in the wavelength conversion element 5 is substantially 15 wt %.

In addition, the LED package structure 100 further includes an encapsulant 6, and the encapsulant 6 covers the second LED chip 21, the third LED chip 22, and the fourth LED chip 23. Furthermore, the encapsulant 6 covers the partition 3 and the wavelength conversion element 5, such that the first accommodating space 721 (or the first light emitting portion 1) has two layers of resin that are stacked upon each other (the wavelength conversion element 5 and the encapsulant 6). Therefore, the blue light emitted by the first LED chip 11 passes through the wavelength conversion element 5, and then scatters through the encapsulant 6. The encapsulant 6 can include a diffuser, such that the first white light L1 has a greater light exiting angle which increases the light mixing uniformity among the first white light L1, the second initial light B1 (green light), the third initial light B2 (red light), and the fourth initial light B3.

The encapsulant 6 contains 0.1 wt % to 5.0 wt % of the diffuser. Preferably, in the embodiment of the present disclosure, the amount of the diffuser contained in the encapsulant 6 is substantially 0.5 wt %. For example, the diffuser can be $TiO_2$, $Al_2O_3$, $SiO_2$, BN, ZrO2, etc., and the present disclosure is not limited thereto. Moreover, the transmittance of the encapsulant 6 is greater than 80%. For example, the encapsulant 6 can be a product produced by Shin-Etsu Chemical Co., Ltd. that has a 90% transmittance rate and a 1.54 refractive index.

Reference is further made to FIG. 2, the base 71 of the casing 7 includes a plurality of leads 70, and the first LED chip 11, the second LED chip 21, the third LED chip 22, and the fourth LED chip 23 are respectively disposed on each of the leads 70. The second LED chip 21, the third LED chip 22, and the fourth LED chip 23 are sequentially arranged from adjacent to the partition 3 toward a direction away from the partition 3. In other words, the partition 3 is disposed between the first LED chip 11 and the second LED chip 21.

As mentioned above, it can be derived from relative positions of the first LED chip 11, the second LED chip 21, the third LED chip 22, and the fourth LED chip 23 that, the LED chips (the first LED chip 11 and the fourth LED chip 23) which emit blue light are at the two outer most sides of the base 71 in the casing 7. On one of the two outer most sides of the base 71, the blue light emitted by the first LED chip 11 passes through the wavelength conversion element 5 containing the phosphor to form the first white light L1. On another one of the two outer most sides of the base 71, the blue light is emitted by the fourth LED chip 23. Therefore, when being lit individually, the fourth LED chip 23 would be disposed farther away from the first white light L1, so as to prevent the blue light emitted by the fourth LED chip 23 from exciting the phosphor on the first LED chip 11 and changing the color of the first white light L1.

Figure 10:
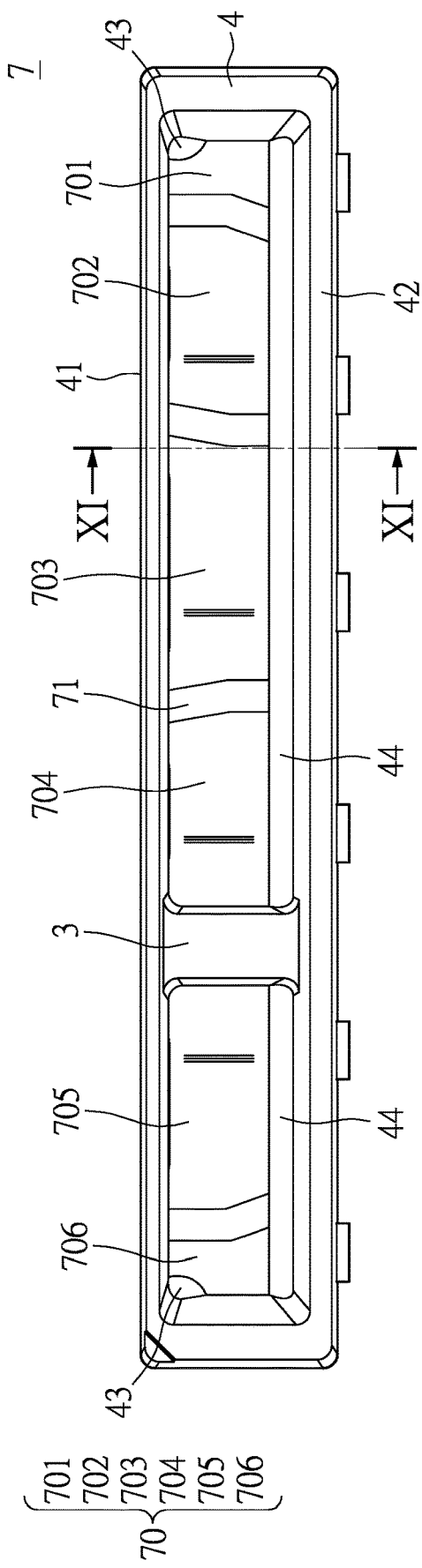
FIG. 10 is a top view of a casing of the LED package structure in the embodiment of the present disclosure.
Figure 11:
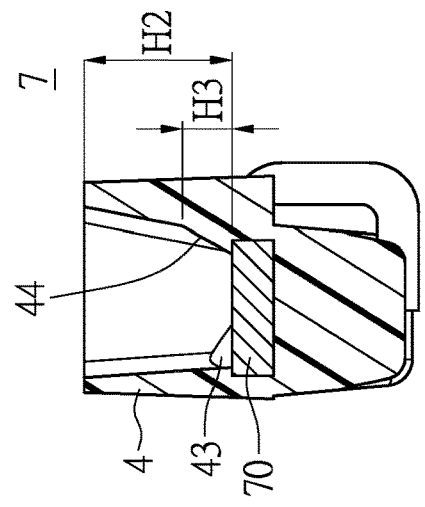
FIG. 11 is a cross-sectional view taken along line XI-XI of FIG. 10.

References are made to FIG. 10 and FIG. 11. FIG. 10 is a top view of a casing of the LED package structure in the embodiment of the present disclosure. FIG. 11 is a cross-sectional view taken along line XI-XI of FIG. 10. As shown in FIG. 10, the base 71 includes plastic materials and the leads 70 made of metal materials. The plastic materials can be the same as those of the surrounding wall 4 and the partition 3, and can be formed on the leads 70 through molding. In other words, the base 71, the surrounding wall 4, the recess 72, and the casing 7 of the partition 3 can collectively be a one-piece structure, but the present disclosure is not limited thereto. In other embodiments, the base 71 can be a board with the leads 70, e.g., a printed circuit board (PCB) or a ceramic circuit board.

Referring further to FIG. 10 and FIG. 11, the surrounding wall 4 has a first long side 41 and a second long side 42, a strengthening portion 43 is disposed on two sides of the first long side 41, and the second long side 42 has a rib portion 44. A design of the strengthening portions 43 and the rib portion 44 is based on the rectangular structure of the surrounding wall 4. As shown in FIG. 11, a height H3 of the rib portion 44 is one-third of the height H2 of the surrounding wall 4. A structure of the rib portion 44 can maximize the structural strength of the surrounding wall 4 without decreasing a die bonding area. A structure of the strengthening portion 43 can further strengthen the structure of the surrounding wall 4.

Figure 12:
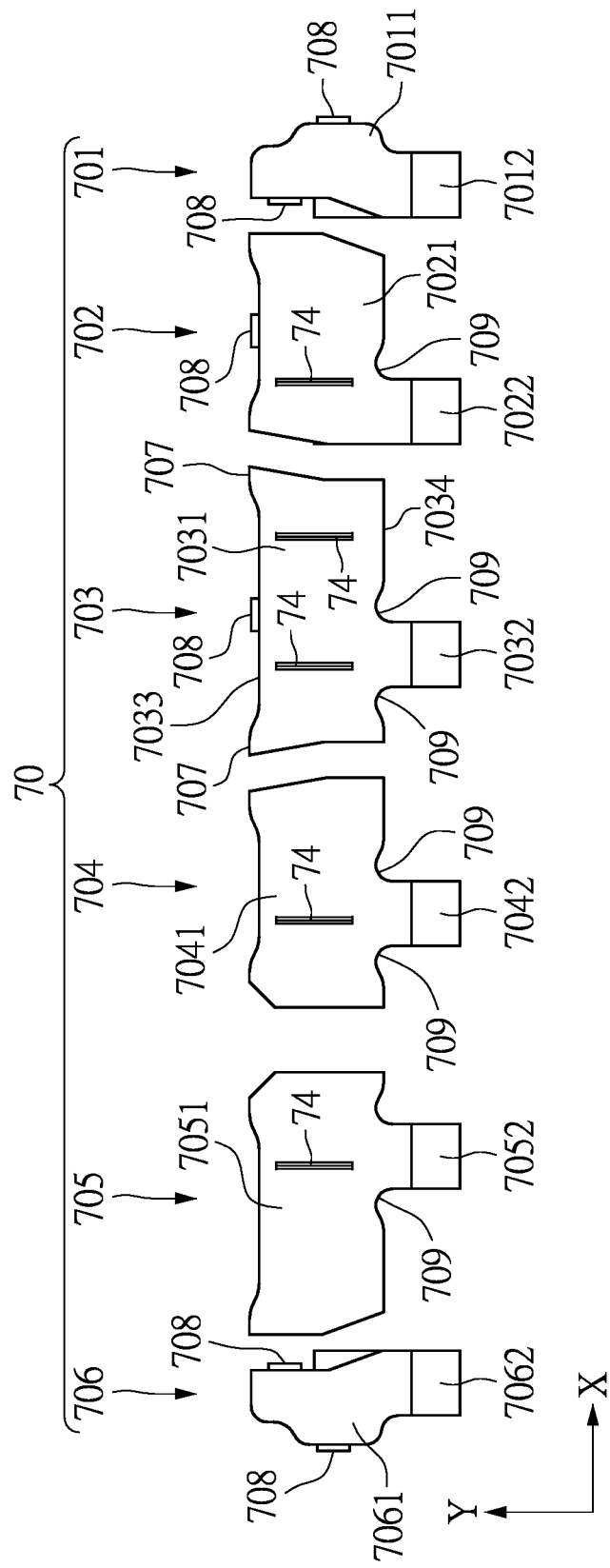
FIG. 12 is a schematic perspective view of leads of the LED package structure in the embodiment of the present disclosure.

Reference is made to FIG. 12, which is a schematic perspective view of leads of the LED package structure in the embodiment of the present disclosure. The leads 70 include a first lead 701, a second lead 702, a third lead 703, a fourth lead 704, a fifth lead 705, and a sixth lead 706. Each of the first lead 701, the second lead 702, the third lead 703, the fourth lead 704, the fifth lead 705, and the sixth lead 706 has a cantilever section and a bended section, and the bended section is connected to one side of the cantilever section. To be more specific, the first lead 701 has a cantilever section 7011 and a bended section 7012, the second lead 702 has a cantilever section 7021 and a bended section 7022, the third lead 703 has a cantilever section 7031 and a bended section 7032, the fourth lead 704 has a cantilever section 7041 and a bended section 7042, the fifth lead 705 has a cantilever section 7051 and a bended section 7052, and the sixth lead 706 has a cantilever section 7061 and a bended section 7062.

Reference is further made to FIG. 12, and the cantilever section 7031 of the third lead 703 has an inverted hook portion 707. Appearance-wise, the cantilever section 7031 of the third lead 703 is a large-area metal sheet in a substantially trapezoidal shape. The cantilever section 7031 of the third lead 703 has two sides corresponding to each other, which are a long side 7033 and a short side 7034. The two sides corresponding to each other (i.e., the long side 7033 and the short side 7034) have a length ratio of 1.1, and the bended section 7032 is connected to the short side 7034. The inverted hook portion 707 is disposed on two ends of the long side 7033 of the cantilever 7031. As mentioned above, the casing 7 is a one-piece structure formed from plastic materials and the leads 70 made of metal materials through molding. However, the cantilever section 7031 of the third lead 703 has a large area which can easily cause curling and wrapping when molding, which can result in structural collapse of the casing 7. Therefore, a design of the inverted hook portion 707 is added on the two ends of the long side 7033 of the cantilever 7031, such that the inverted hook portions 707 are embedded in the structure of the casing 7, thereby preventing the problem of the structural collapse due to the large area of the cantilever 7031 which easily causes curling and wrapping when molding, enhancing the stability of the base 71 formed by the plastic materials and the leads 70 made of the metal materials, and enhancing the subsequent stability of fixing the LED chips on the leads 70 and conducting wire bonding. However, the present disclosure does not limit an adoption of an inverted hook portion. That is to say, in one of the implementations of the present disclosure, at least one of the cantilever sections 7011, 7021, 7031, 7041, 7051, and 7061 (at least one of the leads 701, 702, 703, 704, 705, and 706) can have an inverted hook portion (not shown in the figures).

Furthermore, when the first LED chip 11, the second LED chip 21, the third LED chip 22, and the fourth LED chip 23 are respectively disposed on each of the leads 70 and undergo wire bonding, an end of each of the wires 73 is connected to each of the LED chips, and another end of each of the wires 73 is connected to each of the leads 70, respectively. The leads 70 have different electrodes (anode or cathode), and one of the leads of the present disclosure can be a common anode or a common cathode.

To be more specific, in the embodiment of the present disclosure, the first lead 701 is a cathode. The second lead 702 is a cathode, and the fourth LED chip 23 emitting blue light is disposed thereon. The third lead 703 is a common anode, and the third LED chip 22 emitting red light is disposed thereon. The fourth lead 704 is a cathode, and the second LED chip 21 emitting green light is disposed thereon. The fifth lead 705 is a cathode, and the first LED chip 11 emitting blue light is disposed thereon. The sixth lead 706 is a cathode. By designing the third lead 703 as a common anode, a cathode end of the second LED chip 21, the third LED chip 22, and the fourth LED chip 23 can be connected to the cantilever section 7031 of the third lead 70. Therefore, the trapezoidal-shaped large area of the cantilever 7031 increases the die bonding area and the wire bonding area, which maximizes spatial utilization in a limited area.

Figure 13:
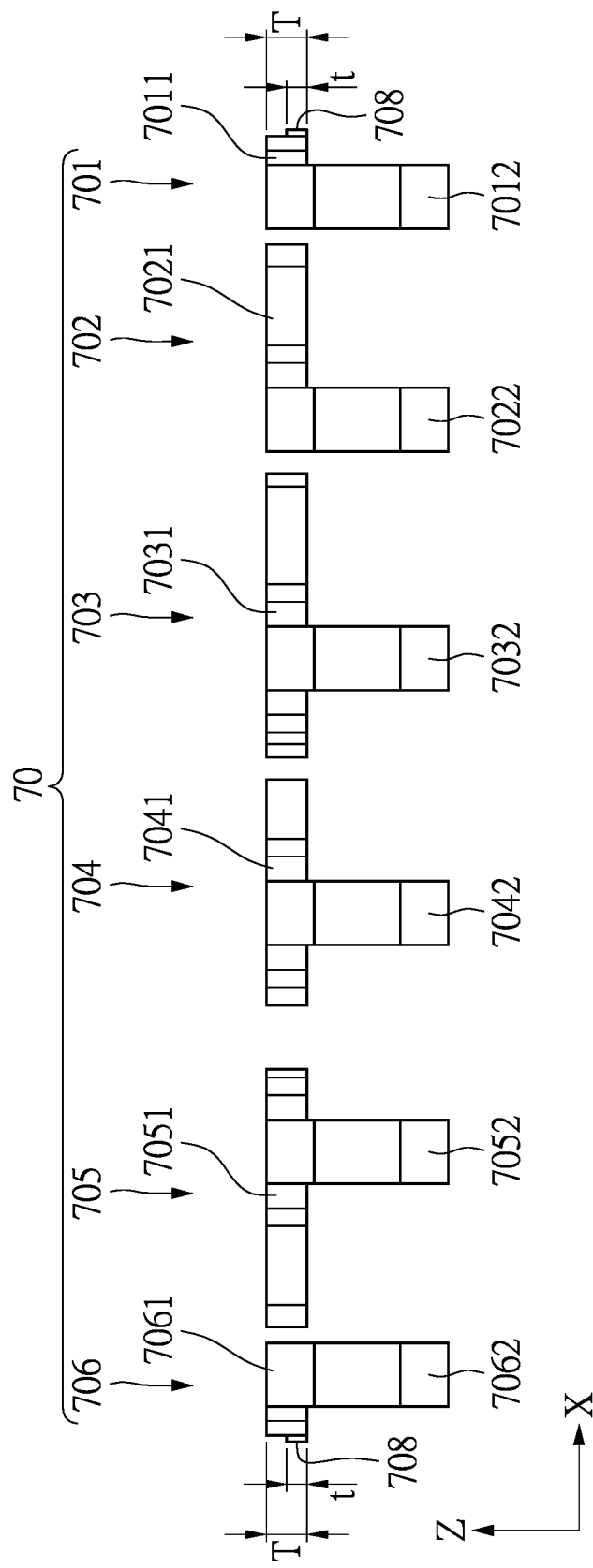
FIG. 13 is a front schematic view of FIG. 12.

References are further made to FIG. 12 and FIG. 13. FIG. 13 is a front schematic view of FIG. 12. Each of the first lead 701, the second lead 702, the third lead 703, and the sixth lead 706 further incudes a step portion 708. Each of the step structure 708 has a thickness t, which is substantially half of a thickness T of each of the leads 70. A design of the step portions 708 is similar to that of the inverted hook portions 707, the step portions 708 are embedded in the plastic materials when molding, thereby enhancing the bonding between the leads and the plastic materials.

Reference is further made to FIG. 13, each of the cantilever sections 7021, 7031, 7041, 7051 and each of the bending sections 7022, 7032, 7042, 7052 of the second lead 702, the third lead 703, the fourth lead 704, and the fifth lead 705 have a recess portion 709 at a connecting junction, respectively. The recess portion 709 is designed to resist residual stress of the bending sections 7022, 7032, 7042, 7052, and decrease a bending area, thereby effectively increasing the bonding between each of the respective bending sections 7022, 7032, 7042, 7052 of the second lead 702, the third lead 703, the fourth lead 704, and the fifth lead 705 and the plastic materials when molding.

It is worth mentioning that, in FIG. 12 and FIG. 13, the inverted hook portion 707 is indicated to be disposed on the third lead 703, the step portions 708 are indicated to be disposed on the second lead 702, the third lead 703, the fourth lead 704, the fifth lead 705, and the sixth lead 706, and the recess portions 709 are indicated to be disposed on the second lead 702, the third lead 703, the fourth lead 704, and the fifth lead 705, but the present disclosure is not limited thereto. In practice, the inverted hook portion 707, the step portions 708, and the recess portions 709 are designed to be adapted to each of the leads 70 (i.e., the first lead 701, the second lead 702, the third lead 703, the fourth lead 704, the fifth lead 705, and the sixth lead 706). A person having ordinary skill in the art is able to apply the inverted hook portion 707, the step portions 708, and the recess portions 709 to one or all of the leads 70, according to the area of each of the cantilever sections and the bending area of each of the bending sections of the leads 70.

Furthermore, as shown in FIG. 12, each of the leads of the LED package structure 100 can have a groove 74. In the present disclosure, the grooves can be disposed on the second lead 702, the third lead 703, the fourth lead 704, and the fifth lead 705, respectively, and the grooves 74 can be V-shaped grooves. Since the LED chips are fixed on the leads 70 through die bonding gel (silver conductive gel), when an amount of the die bonding gel is excessive, the die bonding gel is likely to overflow and be in contact with adjacent wires, thereby causing a short circuit. Therefore, the grooves 74 are disposed to prevent the overflow of the die bonding gel, so as to avoid short-circuiting.

Beneficial Effects of the Embodiment

One of the beneficial effects of the LED package structure 100 provided in the present disclosure is that the LED package structure 100 is able to shorten the optical distance required for the white light source emitted by the LED package structure 100 and enhance the light mixing effect of the LED package structure 100 through the technical solutions of "the LED package structure 100 including the first light emitting portion 1, the second light emitting portion 2, the partition 3, and the surrounding wall 4", "the first light emitting portion 1 including the first LED chip 11 that emits the first initial light A, and the first initial light A passing through the first light emitting portion 1 to form the first white light L1", "the second light emitting portion 2 including the second LED chip 21 emitting the second initial light B1, the third LED chip 22 emitting the third initial light B2, and the fourth LED chip 23 emitting the fourth initial light B3", "the partition 3 being disposed between the first light emitting portion 1 and the second light emitting portion 2, and the surrounding wall 4 being disposed around the partition 3, the first light emitting portion 1 and the second light emitting portion 2", and "the view angle offset of the first white light L1 is less than 1 degree".

Another one of the beneficial effects of the LED package structure 100 provided in the present disclosure is that the LED package structure 100 is able to shorten the optical distance required for the white light source emitted by the LED package structure 100 and enhance the light mixing effect of the LED package structure 100 through the technical solutions of "the LED package structure 100 including the casing 7, the first LED chip 11, the second LED chip 21, the third LED chip 22, and the fourth LED chip 23", "the casing 7 including the base 71, the surrounding wall 4, the recess 72, and the partition 3", "the surrounding wall 4 being disposed on the base 71, and the recess 72 being formed by the surrounding wall 4 and the base 71", "the partition 3 being disposed on the base 71 and connected to the surrounding wall 4", "the partition 3 dividing the recess 72 into the first accommodating space 721 and the second accommodating space 722", "the first LED chip 11 being disposed in the first accommodating space 721", "the height of the partition 3 being less than the height of the surrounding wall 4", and "the second LED chip 21, the third LED chip 22, and the fourth LED chip 23 being disposed in the second accommodating space 722".

Furthermore, under a condition of the height H1 of the partition 3 being substantially 56% of the height H2 of the surrounding wall 4, the LED package structure 100 of the present disclosure has a largest luminous range (the view angle at 110 degrees) and the smallest view angle offset from the center of the LED chip (the bias angle at 0.9 degrees), such that uniform light mixing of the first initial light A, the second initial light B1, the third initial light B2, and the fourth initial light B3 is provided, and the optical distance is effectively shortened to substantially 2 mm. Therefore, electronic devices that utilize the LED package structure 100 provided by the present disclosure can be further downsized by virtue of the shortened optical distance. In addition, the RGB light sources (the second initial light B1, the third initial light B2, and the fourth initial light B3) and the white light source (the first white light L1) of the present disclosure are utilized to shorten the optical distance, thereby reducing the required quantity of the LED chips to reduce costs. Moreover, the design of the height of the partition 3 increases the light exiting area and enhances the optical efficiency of the RGB light sources (the second initial light B1, the third initial light B2, and the fourth initial light B3), e.g., enhancing the optical efficiency of the green light for substantially 8%. Furthermore, the phosphor contained in the wavelength conversion element 5 and the diffuser contained in the encapsulant 6 increase the light exiting angle of the first white light L1, thereby enhancing light mixing uniformity after being mixed with the RGB light sources.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting diode (LED) package structure, comprising:
   a first light emitting portion including a first LED chip, the first LED chip emitting a first initial light, and the first initial light passing through the first light emitting portion to form a first white light;
   a second light emitting portion including a second LED chip emitting a second initial light, a third LED chip emitting a third initial light, and a fourth LED chip emitting a fourth initial light;
   a partition disposed between the first light emitting portion and the second light emitting portion; and
   a surrounding wall disposed around the partition, the first light emitting portion, and the second light emitting portion;
   wherein the first white light has a view angle offset less than 1 degree;
   wherein a volume of the second light emitting portion is greater than a volume of the first light emitting portion.

2. The LED package structure according to claim 1, wherein the partition has a height less than that of the surrounding wall.

3. The LED package structure according to claim 1, wherein each of the first white light, the second initial light, the third initial light, and the fourth initial light has a view angle offset less than 7 degrees.

4. The LED package structure according to claim 1, wherein a height of the partition is within a range between a height of each of the LED chips and 80% of a height of the surrounding wall.

5. The LED package structure according to claim 1, wherein the surrounding wall has a first long side and a second long side, the first long side has a strengthening portion on two sides thereof, and the second long side has a rib portion.

6. The LED package structure according to claim 1, wherein the second initial light is green, the third initial light is red, and the fourth initial light is blue.

7. The LED package structure according to claim 6, wherein the second LED chip, the third LED chip, and the fourth LED chip are sequentially arranged from adjacent to the partition toward a direction away from the partition.

8. The LED package structure according to claim 1, further comprising a base, wherein the surrounding wall is disposed on the base, the partition is disposed on the base, the base includes a plurality of leads, wherein each of the leads has a cantilever section and a bended section, the bended section is connected to one side of the cantilever section.

9. The LED package structure according to claim 8, wherein at least one of the leads has an inverted hook portion.

10. The LED package structure according to claim 8, wherein at least one of the leads is a common anode or a common cathode.

11. The LED package structure according to claim 8, wherein each of the cantilever sections further includes a step portion, and each of the step portions has a thickness less than half of that of the cantilever section.

12. The LED package structure according to claim 8, wherein each of the bended sections has recess portions on two sides thereof, respectively.

13. The LED package structure according to claim 1, wherein the first initial light is blue.

14. The LED package structure according to claim 13, further comprising a wavelength conversion element containing phosphor, the wavelength conversion element covering the first LED chip.

15. The LED package structure according to claim 14, wherein an amount of the phosphor of the wavelength conversion element is between 5 wt % and 45 wt %.

16. The LED package structure according to claim 14, further comprising an encapsulant, the encapsulant covering the second LED chip, the third LED chip, and the fourth LED chip.

17. The LED package structure according to claim 16, wherein the encapsulant further covers the partition and the wavelength conversion element.

18. The LED package structure according to claim 16, wherein the encapsulant has a light transmittance greater than 80%.

19. The LED package structure according to claim 16, wherein the encapsulant contains a diffuser.

20. The LED package structure according to claim 19, wherein an amount of the diffuser in the encapsulant is between 0.1 wt % and 5.0 wt %.

* * * * *